United States Patent
Uihlein et al.

(10) Patent No.: US 12,359,573 B2
(45) Date of Patent: Jul. 15, 2025

(54) BLADE FOR A TURBOMACHINE INCLUDING BLADE TIP ARMOR AND AN EROSION PROTECTION LAYER, AND METHOD FOR MANUFACTURING SAME

(71) Applicant: MTU Aero Engines AG, Munich (DE)

(72) Inventors: Thomas Uihlein, Munich (DE); Ralf Stolle, Munich (DE)

(73) Assignee: MTU Aero Engines AG, Munich (DE)

( * ) Notice: Subject to any disclaimer, the term of this patent is extended or adjusted under 35 U.S.C. 154(b) by 0 days.

(21) Appl. No.: 17/925,703

(22) PCT Filed: Apr. 28, 2021

(86) PCT No.: PCT/DE2021/100387
§ 371 (c)(1),
(2) Date: Nov. 16, 2022

(87) PCT Pub. No.: WO2021/233496
PCT Pub. Date: Nov. 25, 2021

(65) Prior Publication Data
US 2023/0340884 A1    Oct. 26, 2023

(30) Foreign Application Priority Data
May 18, 2020   (DE) .......................... 102020206202.1

(51) Int. Cl.
*F01D 5/28* (2006.01)
*C23C 14/06* (2006.01)
(Continued)

(52) U.S. Cl.
CPC .............. *F01D 5/284* (2013.01); *C23C 14/06* (2013.01); *C23C 14/542* (2013.01); *C25D 3/12* (2013.01);
(Continued)

(58) Field of Classification Search
CPC .......... F01D 5/284; F01D 5/282; F01D 5/288; C23C 14/06; C23C 14/542; C25D 3/12; C25D 15/00
See application file for complete search history.

(56) References Cited

U.S. PATENT DOCUMENTS 5,952,110 A * 9/1999 Schell ..................... F01D 11/12
427/427
2004/0096318 A1 * 5/2004 Ohara ................... F01D 11/122
415/173.4
(Continued)

FOREIGN PATENT DOCUMENTS

DE    10 2004 001392 A1    8/2005
DE       102005030266 A1    1/2007
(Continued)

OTHER PUBLICATIONS

Bayer et al (DE 102005060712)—Machine Translation (Year: 2007).*
ISR of PCT/DE2021/100387 dated Jul. 2, 2021.

*Primary Examiner* — Brian Christopher Delrue
(74) *Attorney, Agent, or Firm* — Davidson Kappel LLC

(57) ABSTRACT

A blade for a turbomachine is provided. The blade at its blade tip (4) includes blade tip armor (5), and an erosion protection layer (11) above the blade tip armor. For the blade, the erosion protection layer in the area of the blade tip has a layer thickness in the range of 5 μm to 100 μm, in particular 10 μm to 50 μm.

13 Claims, 3 Drawing Sheets

(51) Int. Cl.
*C23C 14/54* (2006.01)
*C25D 3/12* (2006.01)
*C25D 15/00* (2006.01)

(52) U.S. Cl.
CPC ............. *C25D 15/00* (2013.01); *F01D 5/282* (2013.01); *F01D 5/288* (2013.01)

(56) References Cited

U.S. PATENT DOCUMENTS

| | | | |
|---|---|---|---|
| 2007/0190351 A1* | 8/2007 | Eichmann | C23C 28/322 |
| | | | 428/622 |
| 2008/0102296 A1* | 5/2008 | Ghasripoor | C23C 14/18 |
| | | | 427/580 |
| 2010/0226782 A1* | 9/2010 | Eichmann | F01D 5/286 |
| | | | 416/241 B |
| 2010/0226783 A1 | 9/2010 | Lipkin et al. | |
| 2011/0103968 A1 | 5/2011 | Hoebel et al. | |
| 2011/0299996 A1 | 12/2011 | Uihlein | |
| 2012/0141822 A1 | 6/2012 | Eichmann et al. | |
| 2012/0288639 A1* | 11/2012 | Hanrieder | C23C 28/3455 |
| | | | 219/601 |
| 2014/0234096 A1* | 8/2014 | Klam | C23C 28/42 |
| | | | 415/217.1 |
| 2016/0333706 A1* | 11/2016 | Uihlein | C23C 14/042 |
| 2017/0096906 A1* | 4/2017 | Werner | C23C 4/129 |
| 2017/0335697 A1* | 11/2017 | Windprechtinger | C23C 28/44 |

FOREIGN PATENT DOCUMENTS

| | | | | |
|---|---|---|---|---|
| DE | 102005060712 A1 * | 6/2007 | ............... | C23C 4/01 |
| DE | 10 2007 027335 A1 | 12/2008 | | |
| DE | 10 2010 049398 | 5/2011 | | |
| DE | 10 2015 208783 | 11/2016 | | |
| EP | 3246430 A1 | 11/2017 | | |
| WO | WO 2010094256 A1 | 8/2010 | | |

* cited by examiner

BLADE FOR A TURBOMACHINE INCLUDING BLADE TIP ARMOR AND AN EROSION PROTECTION LAYER, AND METHOD FOR MANUFACTURING SAME

FIELD OF THE INVENTION

The present invention relates to a blade for a turbomachine including blade tip armor and an erosion protection layer, and a method for manufacturing such a blade.

BACKGROUND

Turbomachines, such as stationary gas turbines or aircraft engines, include, among other things, a plurality of blades that are rotatably situated at a rotor, either to compress the fluid that flows through the turbomachine, or to be driven to rotate by the fluid.

To minimize the flow losses between the rotating blades and a surrounding flow channel boundary, the gap between the blade tips at the radial end of the blades and the flow channel boundary must be as small as possible, so that as little fluid as possible may flow through the gap between the flow channel boundary and the blades.

For this reason, in known turbomachines, so-called labyrinth seals are provided for sealing between the blade tips and the flow channel boundary; for the labyrinth seals, the blade tips move in a groove that forms in a sealing material at the flow channel boundary, during operation of the turbomachine, due to corresponding grinding in of the blade tips. Similarly, it is also known to provide at the blade tips so-called blade tip armor, which includes hard material particles that are embedded in a metal matrix, in order to cut, with the aid of the hard material particles, into the groove for the labyrinth seal in the oppositely situated sealing material of the flow channel boundary and to protect the blade tip from wear.

In addition, blades of turbomachines additionally include protective coatings such as erosion protection layers at the airfoil in order to likewise protect the blade material in the area of the airfoil from wear, for example due to erosion.

A wear- and oxidation-resistant turbine blade is known from Published Unexamined German Patent Application DE 10 2010 049 398 A1, which includes an oxidation-resistant metallic layer, in particular an MCrAlY layer, where M is a metal, in particular nickel, cobalt, or a combination thereof, and which may additionally include a ceramic thermal insulation layer. In addition to this oxidation-resistant protective layer, a protective layer made up of abrasive material and binding material is applied at the blade tip with the aid of laser deposition welding. The oxidation-resistant protective layer is initially applied in the form of the MCrAlY layer over the entire surface of the blade. The MCrAlY layer is mechanically removed in the area of the blade tip, and in the area of the blade tip the wear-resistant protective layer is subsequently applied at the blade tip with the aid of laser deposition welding, so that a protective layer in the form of blade tip armor at the blade tip and a different protective layer at the airfoil are separately present.

SUMMARY OF THE INVENTION

Similarly, a method is known from Published Unexamined German Patent Application DE 10 2015 208 783 A1 for producing partial layers, separated over the surface of the blade, at a blade of a turbomachine in order to create different layers at the airfoil and at the blade tip, in the form of blade tip armor, and an erosion protection layer at the airfoil. In this method, a mask is used to protect the blade tip armor at the blade tip from being coated over with an erosion protection layer, which is applied to the blade after the blade tip armor. As a result, the effort for manufacturing such separate layers, as provided in the document DE 10 2010 049 398 A1 with the removal of an already applied layer and subsequent re-application of a different layer in this area, is minimized. Although good results are already being achieved with such blades for turbomachines, there is a further need to improve such blades with regard to optimal sealing with respect to the flow channel boundary and to extend their service life.

It is an object of the present invention to provide a blade for a turbomachine, and a method for manufacturing such a blade.

Technical Approach

For improving blades for turbomachines, the present invention, unlike the related art, proposes not just to provide blade tip armor, made up of a metal layer with embedded hard material particles, in the area of the blade tip, but, rather, to provide a thin erosion protection layer having a layer thickness in the range of 5 μm to 100 μm above the blade tip armor, since it has been shown that for an arrangement of a thin erosion protection layer above the blade tip armor, the rubbing behavior of the blade at the flow channel may be improved, and thus the efficiency with regard to the seal between the flow channel boundary and the blade may be improved and the wear on the blade may be reduced. Due to the improved rubbing behavior of the blade at the flow channel boundary, the gap between the blade and the flow channel boundary may have a narrower design, thus increasing the efficiency of the turbomachine. Due to the erosion protection layer, the underlying blade tip armor is protected and rapid ablation thereof is prevented. The corresponding layer thickness of the erosion protection layer ensures that the blade tip armor with the hard material particles embedded therein may nevertheless carry out its function; i.e., due to the layer thickness of the erosion protection layer selected according to the present invention, it is ensured that the hard material particles may still implement their abrasive effect. At the same time, sufficient protection of the blade tip armor is ensured, and the erosion protection layer is prevented from chipping off during operation with large temperature fluctuations. The layer thickness may preferably be selected in the range of 10 μm to 50 μm, particularly preferably 15 μm to 35 μm, in order to achieve a particularly efficacious effect.

In addition, for an arrangement of the erosion protection layer on the blade tip armor, the protective layer system in the area of the blade tip may be easily implemented by successive deposition of the blade tip armor and the corrosion protection layer.

The blade tip armor with the overlying erosion protection layer is applied in the area of the blade tip, which is situated opposite from the blade root, and includes a blade tip surface that points in the direction of the flow channel boundary, the blade tip armor with the overlying erosion protection layer being provided at the blade tip surface. The layer thickness of the blade tip armor or erosion layer extends in the radially outwardly directed direction (radially from the standpoint of the rotational axis of the turbomachine), which extends from the blade root in the direction of the blade tip.

The blade may include the erosion protection layer, but no blade tip armor, in the area of the airfoil, so that the erosion protection layer may extend continuously across the airfoil and the blade tip. However, the erosion protection layer in the area of the airfoil may have a much thicker design.

The blade tip armor may be formed by a nickel layer with embedded hard material particles or an MCrAlY layer with embedded hard material particles, where M of the MCrAlY layer is a metal, in particular nickel, cobalt, or iron, and the embedded hard material particles include boron nitride, preferably cubic boron nitride, and/or oxides, in particular aluminum oxide, and/or carbides.

The erosion protection layer may be formed by different erosion protection layers, as described in DE 10 2004 001 392 A1 and DE 10 2007 027 335 A1, or WO 2010 094 256 A1, for example, the disclosed content of the cited documents being incorporated by reference in full.

In the simplest case, the erosion protection layer may be formed from a metal layer and a ceramic layer or ceramic-containing layer, it being possible for the metal layer to also be a metal alloy layer. Such layers may be repeatedly arranged in a layered stack. In addition, the erosion partial protection system may also be formed from a four-layer system that includes a metal layer, a metal alloy layer, a metal-ceramic mixed layer, and a ceramic layer. Furthermore, three-layer systems including a metal alloy layer, a metal-ceramic mixed layer, and a ceramic layer, for example, are also possible. These layer sequences of 2, 3, or 4 layers may be provided multiple times in the erosion partial protection system. The individual partial layers and in particular the metal-ceramic mixed layer may also be designed as gradient layers, in which the composition changes in the direction of the layer thickness.

Numerous metals are suitable for the metal layer and the metal alloy layer, for example titanium, platinum, palladium, tungsten, chromium, nickel, or cobalt for the metal layer, and in addition metallic elements such as iron, aluminum, zirconium, hafnium, tantalum, magnesium, molybdenum, or silicon for the metal alloy layer. For example, the layer sequence of the erosion partial protection system may be formed by a nickel layer, a nickel-chromium layer, a metal-ceramic layer containing chromium and nitrogen, with chromium present in excess, and a chromium-nitride layer. Alternatively, a titanium layer, a palladium layer, or a platinum layer to which a TiCrAl or CoAlCr material is applied may also be provided as the first metallic layer. Subsequently, $CrAlN_{1-x}$ or $TiAlN_{1-x}$ may be provided as the metal-ceramic mixed layer, and TiAlN, TiAlSiN, AlTiN, or a mixture of TiN and AlN may be provided as the ceramic layer. In addition, a chromium layer as the metal layer, a chromium-nickel layer as the metal alloy layer, a CrAlN layer with an excess of chromium and aluminum as the metal-ceramic mixed layer, and a CrAlN layer as the ceramic layer may be provided. For such a layer sequence or also for the other layer systems, diffusion barrier layers, for example in the form of a CrN layer between partial layers of the erosion protection layer, may be additionally provided. Phase-stabilizing elements such as tungsten, tantalum, molybdenum, silicon, titanium, vanadium, or yttrium may be provided within the individual layers, in particular the metal-ceramic layer or the metal material. In general, the metal-ceramic mixed layer or ceramic layer or ceramic-containing layer of the erosion protection layer may be formed by oxides, nitrides, carbides, or borides of the components of the metal layer or of the metal alloy layer.

The blade may be made of a titanium-based material, an iron-based material, a nickel-based material, or a cobalt-based material, it being possible in particular for the iron-based material to include chromium-containing steels or iron-based superalloys, for the nickel-based material to include nickel-based superalloys, and for the cobalt-based material to include cobalt-based superalloys. The alloys whose main component is the particular element after which the base alloy is named are referred to as corresponding base materials or base alloys, so that for an iron-based alloy, for example, the main component is iron. In particular, known base materials for use in rotor blades of turbomachines may be employed.

The blade tip armor may be applied using any suitable method, for example by electroplating a nickel matrix, for example, with the hard material particles embedded therein, such as particles of boron nitride, or by soldering or by applying a slip layer or by physical vapor deposition or by spraying, in particular thermal or plasma-assisted spraying.

Correspondingly, according to a further preferred aspect the present invention relates to a method for manufacturing a blade of a turbomachine, in particular a blade according to one of the above aspects, in which blade tip armor is initially applied at the blade tip, and an erosion protection layer is subsequently applied above the blade tip armor. The erosion protection layer is preferably applied directly, and with strong adherence, to the matrix of the blade tip armor.

The erosion protection layer may be deposited by vapor deposition, in particular physical vapor deposition (PVD), it being possible to use in particular evaporation deposition, cathodic arc deposition, electron beam evaporation, atomization (sputtering), and/or magnetron sputtering.

BRIEF DESCRIPTION OF THE DRAWINGS

The appended drawings show the following in a purely schematic manner.

DETAILED DESCRIPTION

Further advantages, characteristics, and features of the present invention will become apparent in the following detailed description of the exemplary embodiments. However, the present invention is not limited to these exemplary embodiments.

Figure 1:
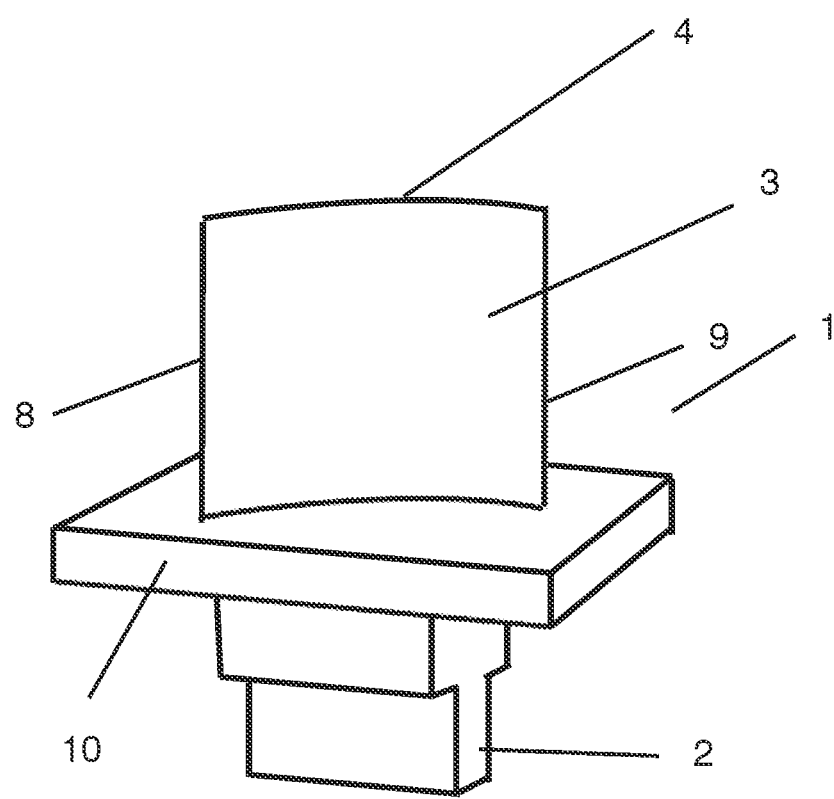
FIG. 1 shows a perspective view of a blade, as may be used in turbomachines.

FIG. 1 shows in a purely schematic manner a perspective view of a blade as may be used in a turbomachine, for example a stationary gas turbine or an aircraft engine. Blade 1 includes a blade root 2 which may be inserted into a disk that rotates together with a shaft of the turbomachine. Blade 1 also includes an airfoil 3 that is situated in the flow channel of the turbomachine, the airfoil either compressing the fluid flowing through the turbomachine or being driven by the fluid flowing past. A shroud 10 is situated between blade root 2 and airfoil 3. So-called blade tip 4, which for avoiding flow losses rests as closely as possible against a surrounding flow channel housing or even grinds into same, is situated at the radially outward end of blade 1. For this purpose, blade tip armor which also has a cutting function is provided at blade tip 4 (cf. FIG. 3), so that blade tip 4 may cut into a surrounding flow channel housing or into sealing material situated at same. For example, the blade tip armor may be formed by a coating with a nickel matrix 6 that includes embedded cubic boron nitride particles 7.

Figure 2:
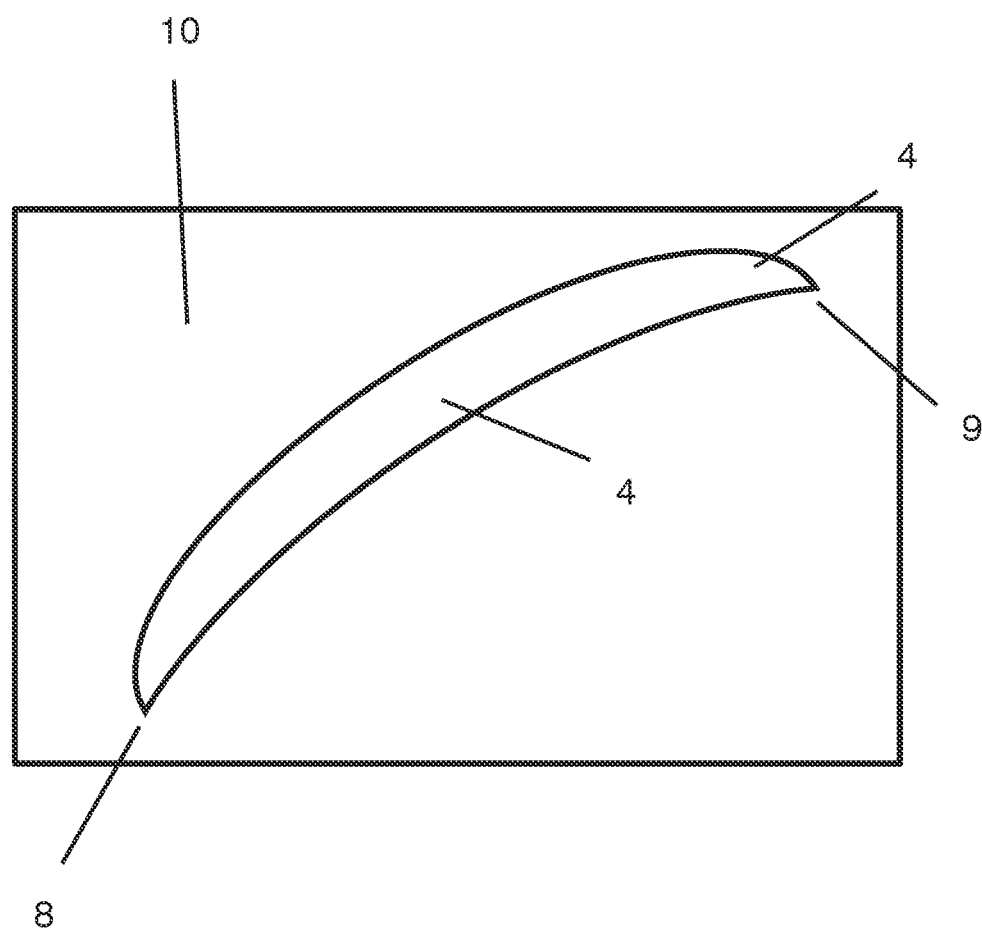
FIG. 2 shows a top view onto the blade tip of the blade according to FIG. 1.

FIG. 2 shows in a purely schematic illustration a top view onto the blade from FIG. 1. It is apparent that blade tip 4 includes a blade tip surface that faces away from the blade root, and that in the shown example has a basic shape of a banana. According to the present invention, blade tip armor 5 and an erosion protection layer are situated on the blade tip surface.

Figure 3A:
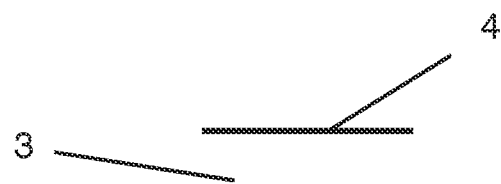
FIGS. 3a, 3b and 3c show a portion of a turbine blade in a sectional view according to various method steps of the method according to the present invention.
Figure 3B:
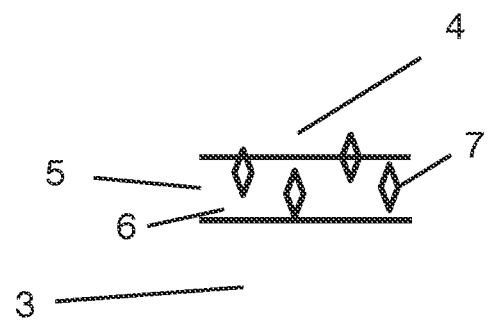
Figure 3C:
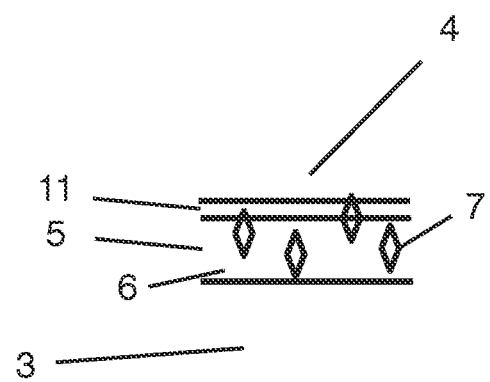

FIGS. 3 a) through c) show the various stages during the manufacture of a blade 1 that includes blade tip armor 5 and an erosion protection layer 11 at blade tip 4.

FIG. 3a) shows a portion of a blade 1 together with airfoil 3 and blade tip 4.

According to FIG. 3b), blade tip armor 5, made up of a nickel matrix 6 and hard material particles 7 made of cubic boron nitride embedded therein, is applied to blade tip 4. The application of blade tip armor 5 takes place, for example, by electroplating nickel matrix 6 in which the cubic boron nitride particles are embedded. However, the blade tip armor may also be implemented in some other suitable manner.

After blade tip armor 5 is completed, erosion protection layer 11 is applied (cf. FIG. 3 c)), hard material particles 7 that are embedded in blade tip armor 5 and protrude from blade tip armor 5 being incorporated into the erosion protection layer. Since erosion protection layer 11, having a thickness of 25 µm, for example, is so thin that protruding hard material particles 7 cannot be completely accommodated in erosion protection layer 11, a portion of hard material particles 7 may protrude beyond erosion protection layer 11 in order to cut in, via the hard material particles, a groove for the labyrinth seal in the oppositely situated sealing material of the flow channel boundary.

Erosion protection layer 11 may be deposited by physical vapor deposition (PVD), in particular using various methods of vapor deposition or applying the corresponding partial layers of the multilayer erosion protection layer by atomization (sputtering).

Although the present invention has been described in detail with reference to the exemplary embodiments, it is naturally understood by those skilled in the art that the present invention is not limited to these exemplary embodiments; rather, modifications are possible in such a way that individual features may be omitted or other combinations of features may be implemented without departing from the scope of protection of the appended claims. In particular, the present disclosure encompasses all combinations of the individual features presented in the various exemplary embodiments, so that individual features that are described only in conjunction with one exemplary embodiment may also be used for other exemplary embodiments or combinations of individual features not explicitly described.

LIST OF REFERENCE NUMERALS 1 blade
2 blade root
3 airfoil
4 blade tip
5 blade tip armor
6 Ni matrix
7 BN particles (hard material particles)
8 leading edge
9 trailing edge
10 shroud
11 erosion protection layer

The invention claimed is:

1. A blade for a turbomachine, the blade comprising:
a blade tip including blade tip armor,
wherein the blade tip armor includes a nickel layer with embedded hard material particles or an MCrAlY layer with embedded hard material particles, where M of the MCrAlY layer is a metal; the embedded hard material particles protruding from a surface of the nickel or MCrAlY layer;
an erosion protection layer on the surface of the blade tip and having a layer thickness in the range of 10 µm to 50 µm so that a portion of the hard material particles protrudes beyond the erosion protection layer;
wherein the erosion protection layer includes at least one metal layer and a ceramic layer; and
wherein the erosion protection layer includes multiple repeated, layer sequences of the metal layer and the ceramic layer.

2. The blade as recited in claim 1 wherein the layer thickness is in the range of 15 µm to 35 µm.

3. The blade as recited in claim 1 wherein the blade includes an airfoil, the erosion protection layer, but no blade tip armor, being in the area of the airfoil.

4. The blade as recited in claim 1 wherein the blade tip armor has the MCrAlY layer and M is nickel, cobalt, or iron, and the embedded hard material particles include oxides or carbides or boron nitride.

5. The blade as recited in claim 4 wherein the embedded hard material particles include cubic boron nitride or aluminum oxide.

6. The blade as recited in claim 1 wherein the metal layer of the erosion protection layer includes titanium, platinum, palladium, tungsten, chromium, nickel, or cobalt.

7. The blade as recited in claim 1 wherein the ceramic layer of the erosion protection layer includes at least one oxide, nitride, carbide, or boride of at least one metal of the metal layer.

8. The blade as recited in claim 1 wherein the blade includes a Cr-containing steel, a nickel-based superalloy, an iron-based superalloy, a titanium-based alloy, or a cobalt-based superalloy.

9. A method for manufacturing the blade as recited in claim 1, the method comprising initially applying the blade tip armor at the blade tip, and subsequently applying the erosion protection layer above the blade tip armor, wherein the application of the blade tip armor takes place via a process from the group including electroplating, soldering, applying a slip layer, physical and chemical vapor deposition, and spraying.

10. The method as recited in claim 9 wherein the process is spraying.

11. The method as recited in claim 10 wherein the spraying is thermal spraying.

12. The method as recited in claim 10 wherein the spraying is plasma-assisted-spraying.

13. The method as recited in claim 9 wherein the blade tip armor includes the MCrAlY layer with embedded hard material particles, where M of the MCrAlY layer is a metal.

\* \* \* \* \*